(12) United States Patent
Nishinaka et al.

(10) Patent No.: US 7,101,619 B2
(45) Date of Patent: *Sep. 5, 2006

(54) LAMINATE

(75) Inventors: Masaru Nishinaka, Otsu (JP); Takashi Itoh, Otsu (JP); Kanji Shimo-Ohsako, Settsu (JP)

(73) Assignee: Kaneka Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/134,655

(22) Filed: May 20, 2005

(65) Prior Publication Data

US 2005/0221080 A1   Oct. 6, 2005

Related U.S. Application Data

(63) Continuation of application No. 10/169,327, filed as application No. PCT/JP01/09427 on Oct. 26, 2001, now Pat. No. 6,911,265.

(30) Foreign Application Priority Data

Oct. 27, 2000   (JP)   .............................. 2000-328125

(51) Int. Cl.
B32B 7/12    (2006.01)
B32B 15/08    (2006.01)

(52) U.S. Cl. ...................................... 428/344; 428/458
(58) Field of Classification Search ................ 428/344, 428/458
See application file for complete search history.

(56) References Cited

U.S. PATENT DOCUMENTS

| 4,075,420 | A | * | 2/1978 | Walton ....................... 174/251 |
| 4,543,295 | A | * | 9/1985 | St. Clair et al. ............ 428/458 |
| 4,639,285 | A | * | 1/1987 | Suzuki et al. ............ 156/272.6 |
| 4,937,133 | A | * | 6/1990 | Watanabe et al. ........... 428/209 |
| 5,130,192 | A | * | 7/1992 | Takabayashi et al. |
| 5,690,837 | A | * | 11/1997 | Nakaso et al. ................. 216/17 |
| 6,207,739 | B1 | * | 3/2001 | Ono et al. .................... 524/218 |
| 6,548,180 | B1 | * | 4/2003 | Yamamoto et al. ...... 428/473.5 |
| 6,586,081 | B1 | * | 7/2003 | Nishinaka et al. .......... 428/209 |

* cited by examiner

Primary Examiner—Cathy F. Lam
(74) Attorney, Agent, or Firm—Brinks Hofer Gilson & Lione

(57) ABSTRACT

The present invention provides a laminate used for a printed wiring substrate and a multilayer printed wiring board which have high heat resistance, wiring patterns with narrow pitches, vias with a small diameter, insulating layer having uniform thickness and stable adhesion between the metal layer and the synthetic resin film, and which contribute to miniaturization, high capability and functional improvement of electronic equipment. The present invention relates to a metal laminate comprising a metal layer laminated on one or both faces of a synthetic resin film, wherein the metal layer is a metal foil having a thickness of at most 5 μm. The present invention also relates to a laminate comprising a metal layer having a thickness of at most 5 μm on one or both faces of a synthetic resin film, wherein the synthetic resin film is a polyimide film obtained by immersing a partially imidized or partially dried poly(amide acid) film in a solution of a compound containing at least one element selected from the group consisting of aluminum, silicon, titanium, manganese, iron, cobalt, copper, zinc, tin, antimony, lead, bismuth and palladium or by applying the solution to the film, and then completely drying and imidizing the poly(amide acid) film, the resulting polyimide film containing at least one of the elements.

5 Claims, No Drawings

LAMINATE

RELATED APPLICATIONS

This application is a continuation of application Ser. No. 10/169,327 filed Oct. 28, 2002, now Pat. No. 6,911,265, which is hereby incorporated by reference herein. application Ser. No. 10/169,327 is a nationalization of PCT application PCT/JP01/09427 filed Oct. 26, 2001, which claims priority from the PCT application and Japan Application Serial No. 2000-328125 filed Oct. 27, 2000.

TECHNICAL FIELD

The present invention relates to a laminate comprising a synthetic resin film and a metal layer laminated on each other, and more particularly, a laminate which can provide a printed wiring substrate and a multilayer printed wiring board having high heat resistance, wiring patterns with narrow pitches, vias with a small diameter, insulating layer having uniform thickness and stable adhesion between the metal layer and the synthetic resin film.

BACKGROUND ART

With the advancement of miniaturization, high capability and functional improvement of electronic equipment, wiring boards are required to be suitable for high density installation. In order to satisfy such requirement, wiring boards are made multilayered, an insulating layer is thinned, a via diameter is made small, and a circuit is made to have narrow pitches.

As the technology for achieving such advancement, to make a metal layer thin has been known effective and there have been proposed methods for obtaining circuit substrates with a thin metal layer by forming a thin film of a metal on the synthetic resin film surface by vacuum evaporation or sputtering, and forming a metal layer with a prescribed thickness on the film by electroplating, and some of the methods are employed practically. However, the methods have a problem that the adhesion strength of the film surface and the metal thin film is low or that the heat resistance of the adhesion is low. Further, in order to avoid such a problem, there are methods comprising steps of forming, on the surface of a synthetic resin film, a thin film of a metal, which is different from a metal to form a circuit and has excellent adhesion property to a synthetic resin film, and then forming a metal with which a circuit is formed. Even by such methods, not only sufficient adhesion strength between the film surface and the metal layer cannot be obtained but also there occurs a problem in the electric resistance stability in circuits owing to the lamination of two or more kinds of metals. Further, there are other problems that the metal layers formed by a combination of thin film formation by vacuum evaporation, sputtering or the like with a plating method have pin holes and uneven layer thickness.

On the other hand, in order to obtain a laminate with a thin metal layer, it is supposed to be proper to use a thin metal foil. However, when the metal foil is thin, the metal foil ruptures owing to the insufficient strength and causes a problem of wrinkling at the time of lamination and therefore it is required for the metal foil to have a thickness of at least 10 μm in order to stably manufacture the laminate.

The present invention aims to solve such problems and provide a laminate for a printed wiring substrate and a multilayer printed wiring board which have high heat resistance, wiring patterns with narrow pitches, vias with a small diameter, insulating layer having uniform thickness and stable adhesion between the metal layer and the synthetic resin film, and which contribute to miniaturization, high capability and functional improvement of electronic equipment.

DISCLOSURE OF INVENTION

In order to solve the above described problems, enthusiastic investigations have been made and accordingly it has been found that a laminate having high heat resistance, wiring patterns with narrow pitches, vias with a small diameter, insulating layer having uniform thickness and stable adhesion between the metal layer and the synthetic resin film can be obtained by laminating a metal foil with a specified thickness and a synthetic resin film to achieve the present invention. Further, it has been found that a laminate having high heat resistance, wiring patterns with narrow pitches, vias with a small diameter, insulating layer having uniform thickness, and stable adhesion between the metal layer and the synthetic resin film can be obtained by laminating a metal layer and a polyimide film subjected to a specified surface treatment to achieve the present invention.

That is, the present invention relates to a laminate comprising a metal layer laminated on one or both faces of a synthetic resin film, wherein the metal layer is a metal foil having a thickness of at most 5 μm.

It is preferable that the metal layer is laminated on one face of the synthetic resin film and an adhesive layer is laminated on the other face of the synthetic resin film.

It is preferable that the synthetic resin film and the metal layer are bonded with an adhesive.

It is preferable that the adhesive contains a polyimide resin.

It is preferable that the adhesive containing the polyimide resin contains a thermosetting resin.

It is preferable that the adhesive is laminated on a metal layer or a circuit substrate at a temperature of at most 220° C.

It is preferable that a polyimide film is used as the synthetic resin film.

It is preferable that the polyimide film has a thickness of at most 50 μm, a tensile modulus of at least 4 GPa and a coefficient of linear expansion of at most 20 ppm.

It is preferable that the metal foil is a metal foil supported by a carrier.

It is preferable that the synthetic resin film is a polyimide film obtained by immersing a partially imidized or partially dried poly(amide acid) film in a solution of a compound containing at least one element selected from the group consisting of aluminum, silicon, titanium, manganese, iron, cobalt, copper, zinc, tin, antimony, lead, bismuth and palladium or by applying the solution to the film, and then completely drying and imidizing the poly(amide acid) film, the resulting polyimide film containing at least one of the elements.

The present invention also relates to a laminate comprising a metal layer having a thickness of at most 5 μm on one or both faces of a synthetic resin film, wherein the synthetic resin film is a polyimide film obtained by immersing a partially imidized or partially dried poly(amide acid) film in a solution of a compound containing at least one element selected from the group consisting of aluminum, silicon, titanium, manganese, iron, cobalt, copper, zinc, tin, antimony, lead, bismuth and palladium or by applying the solution to the film, and then completely drying and imidizing the poly(amide acid) film, the resulting polyimide film containing at least one of the elements.

It is preferable that a metal layer having a thickness of at most 5 μm is laminated on one face of the synthetic resin film and an adhesive layer is laminated on the other face of the synthetic resin film.

It is preferable that the adhesive contains a polyimide resin.

It is preferable that the adhesive contains a thermosetting resin.

It is preferable that the adhesive is laminated on a metal layer or a circuit substrate at a temperature of at most 220° C.

It is preferable that the metal layer is formed directly on the synthetic resin film by a method selected from the group consisting of sputtering, ion plating, electron beam evaporation, resistance heating evaporation, chemical plating, and electroplating.

BEST MODE FOR CARRYING OUT THE INVENTION

The laminate of the present invention comprises a metal layer on one or both faces of a synthetic resin film. A wiring circuit is formed with the metal layer of the laminate to give a printed wiring board.

The synthetic resin film which constitutes the laminate of the present invention is preferably a polyimide film in view of the high heat resistance, excellent electric insulation property and flexibility.

For the metal layer, a metal foil is used since stable bonding strength can be obtained by metal foil surface roughening technique. A metal of the metal foil includes metals such as copper (Cu), aluminum (Al), gold (Au), silver (Ag), chromium (Cr), nickel (Ni), tungsten (W), titanium (Ti), molybdenum (Mo) and cobalt (Co). The metal may be used as a single element or in form of alloy of two or more. Especially, as a material for a wiring circuit, copper and a copper alloy, which have a low electric resistance, are preferable.

The thickness of the metal foil is at most 5 μm, preferably at most 3 μm. If thicker than 5 μm, formation of circuits with narrow pitches, which is a purpose of the present invention, becomes difficult. Incidentally, if the metal foil has a conductivity necessary to operate the circuits, there is no lower limit of the thickness. However, in case of the metal foil, the lower limit is about 0.5 μm on the basis of the present technical level from the viewpoint of the lower limit of the thickness to produce a metal foil which is sufficiently uniform for actual use, and of easy handling of the foil at the time of producing the laminate. Above all, a copper foil with a thickness of at most 5 μm is preferable for forming wiring patterns with narrow pitches and vias with a small diameter.

In the present invention, a metal foil such as a copper foil with a thickness of at most 5 μm can be laminated flatly with a high adhesion strength to a synthetic resin film with no surface unevenness and excellent appearance. According to this, further preferable wiring patterns with narrow pitches and vias with a small diameter are made possible to be formed.

The method for forming a metal foil on one or both faces of the synthetic resin film includes a method for laminating a metal foil such as a copper foil with an adhesive, a method by spreading and applying a synthetic resin solution on a metal foil and then drying, a method by spreading and applying a synthetic resin in melted state on a metal foil and then cooling and curing the resin, a method by setting a thermoplastic resin sheet and a metal foil face to face and laminating by pressurizing and/or heating them by a press or lamination method, and a method by setting a thermosetting resin sheet and a metal foil face to face and laminating by pressurizing and/or heating them by press or lamination method. Above all, it is preferable to laminate the metal foil with an adhesive from the viewpoint of bonding strength and adhesion strength between the synthetic resin film and the metal foil; heat resistance and heat-and-moisture resistance of the adhesion; evenness of electric resistance of circuits; evenness of the thickness of the metal foil; the number of defects such as pin holes; and productivity of the laminate.

It is preferable that the laminate of the present invention comprises a metal layer on one face and an adhesive layer on the other face of the synthetic resin film. The laminate with such a structure can be suitably used for producing a so-called build-up type substrate wherein an insulating layer and a metal layer are formed on the surface of a printed wiring board. In case of producing a multilayer wiring board by using such a laminate according to the build-up method, it is possible to prevent the insulating layer from becoming extremely thin and uniform thickness of the insulating layer can be achieved since the synthetic resin film and the adhesive layer form an insulating layer.

The adhesive layer is laminated on the opposite face to the face of the synthetic resin film where the metal layer is formed. The adhesive which constitutes the adhesive layer includes those similar to the adhesive used for bonding the synthetic resin film and the metal film.

The laminate of the present invention is laminated on an inner layer board by heat press, roll heating or such method, and used as a multilayer board. In this case, the adhesive layer located on one face of the laminate is brought into contact with a circuit of the inner layer board and melted and bonded to the board. Accordingly, the inner layer circuit is fixed while being buried in the adhesive. The surface roughness by the inner layer circuit can be smoothed by flow of the adhesive into the uneven surface of the inner layer circuit owing to the thermal fluidity of the adhesive at the time of laminating process.

A resin composition to be employed as the adhesive to bond the synthetic resin film and metal foil, and as the adhesive which constitutes the adhesive layer is not particularly limited in the type, and a variety of well known resins can be employed. The types of the resins can be roughly classified into thermofusible adhesives using thermoplastic resins and curable type adhesives based on the curing reaction of thermosetting resins. The thermoplastic resins include a polyimide resin, a poly(amide imide) resin, a poly(ether imide) resin, a polyamide resin, a polyester resin, a polycarbonate resin, a polyketoneresin, a polysulfone resin, a polyphenylene ether resin, a polyolefin resin, a polyphenylene sulfide resin, a fluoro resin, a polyallylate resin, a liquid crystal polymer resin and the like. They may be used alone or in combination of two or more for the adhesive layer of the laminate of the present invention. Above all, it is preferable to use a thermoplastic polyimide resin from the viewpoint of excellent heat resistance and electric reliability.

Herein, the method of producing a thermoplastic polyimide resin is described. The polyimide resin can be obtained from a solution of a poly(amide acid) polymer, which is a precursor of the polyimide. The poly(amide acid) polymer solution can be produced by a known method. That is, the solution can be obtained by polymerizing practically equal mole of a tetracarboxylic acid dianhydride component and a diamine component in an organic polar solvent. The acid dianhydride to be used for the thermoplastic polyimide resin is not particularly limited as long as it is an acid dianhydride. Examples of acid dianhydride components include aliphatic or alicyclic tetracarboxylic acid dianhydrides such as butanetetracarboxylic acid dianhydride, 1,2,3,4-cyclobutanetetracarboxylic acid dianhydride, 1,3-dimethyl-1,2,3,4-cyclobutanetetracarboxylic acid dianhydride, 1,2,3,4-cyclopentanetetracarboxylic acid dianhydride, 2,3,5-tricarboxycyclopentylacetate dianhydride, 3,5,6-tricarboxynorbornane-2-acetic acid dianhydride, 2,3,4,5-tetrahydrofurantetracarboxylic acid dianhydride, 5-(2,5-dioxotetrahydrofuranyl)-3-methyl-3-cyclohexene-1,2-dicarboylic acid dianhydride, bicyclo[2,2,2]-oct-7-ene-2,3,5,6-tetracarboxylic acid dianhydride; aromatic tetracarboxylic acid dianhydrides such as pyromellitic acid dianhydride, 3,3',4,4'-benzophenonetetracarboxylic acid dianhydride, 3,3',4,4'-diphenylsulfonetetracarboxylic acid dianhydride, 1,4,5,8-naphthalenetetracarboxylic acid dianhydride, 2,3,6,7-naphthalenetetracarboxylic acid dianhydride, 4,4'-oxyphthalic acid anhydride, 3,3',4,4'-dimethyldiphenylsilanetetracarboxylic acid dianhydride, 3,3',4,4'-tetraphenylsilanetetracarboxylic acid dianhydride, 1,2,3,4-furantetracarboxylic acid dianhydride, 4,4'-bis(3,4-dicarboxyphenoxy)diphenylsulfide dianhydride, 4,4'-bis(3,4-dicarboxyphenoxy)diphenylsulfone dianhydride, 4,4'-bis(3,4-dicarboxyphenoxy)diphenylpropane dianhydride, 4,4'-hexafluoroisopropylidenediphthalic acid anhydride, 3,3',4,4'-biphenyltetracarboxylic acid dianhydride, 2,3,3',4'-diphenyltetracarboxylic acid dianhydride, bis(phthalic acid)phenylsulfine oxide dianhydride, p-phenylene-bis(triphenylphthalic acid) dianhydride, m-phenylene-bis(triphenylphthalic acid) dianhydride, bis(triphenylphthalic acid)-4,4'-diphenyl ether dianhydride, bis(triphenylphthalic acid)-4,4'-diphenylmethane dianhydride; and 2,2-bis(4-hydroxyphenyl)propanedibenzoate-3,3',4,4'-tetracarboxylic acid dianhydride. In order to obtain excellent thermofusibility, it is preferable to use 2,2-bis(4-hydroxyphenyl)propanedibenzoate-3,3',4,4'-tetracarboxylic acid dianhydride, 4,4'-hexafluoroisopropylidenediphthalic acid anhydride, 2,3,3',4'-biphenyltetracarboxylic acid dianhydride, 4,4'-oxydiphthalic acid anhydride and 3,3',4,4'-benzophenonetetracarboxylic acid dianhydride.

Examples of diamine components include 4,4'-diaminodiphenyl ether, 3,4'-diaminodiphenyl ether, 2,2-bis(4-aminophenoxyphenyl)propane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4'-bis(4-aminophenoxy)biphenyl, 2,2-bis(4-aminophenoxyphenyl)hexafluoropropane, 4,4'-diaminodiphenylsulfone, 3,3'-diaminodiphenylsulfone, 9,9-bis(4-aminophenyl)fluorene, bisaminophenoxy ketone, 4,4'-[1,4-phenylenebis(1-methylethylidene)]bisaniline, 4,4'-[1,3-phenylenebis(1-methylethylidene)]bisaniline and the like. They may be used alone or in combination of two or more.

The organic polar solvent to be employed for the generation reaction of the poly(amide acid) solution include, for example, sulfoxide solvents such as dimethyl sulfoxide and diethyl sulfoxide; formamide solvents such as N,N-dimethylformamide and N,N-diethylformamide; acetamide solvents such as N,N-dimethylacetamide and N,N-diethylacetamide; pyrrolidone solvents such as N-methyl-2-pyrrolidone and N-vinyl-2-pyrrolidone; phenol solvents such as phenol, o-, m- or p-cresol, xylenol, halogenated phenol and catechol; hexamethyl phosphorus amide; γ-butyrolactone and the like. Further, based on the necessity, these organic polar solvents may be used in combination with an aromatic hydrocarbon such as xylene or toluene.

The thus-obtained poly(amide acid) polymer solution is subjected to dehydration ring closing by a thermal or chemical method to obtain a thermoplastic polyimide resin. Both of the thermal method of dehydrating the poly(amide acid) solution by heating and the chemical method of dehydrating the poly(amide acid) solution using a dehydration agent can be employed.

Examples of methods of the thermal dehydration ring closing include a method such that an imidization reaction of the poly(amide acid) solution is promoted by heating while evaporating a solvent simultaneously. According to this method, a solid thermoplastic polyimide resin can be obtained. The heating conditions are not particularly limited, but it is preferable to carry out the heating at a temperature of 200° C. or lower for about 5 to 120 minutes.

Examples of methods of the chemical dehydration ring closing include a method such that dehydration reaction is carried out by adding, to the poly(amide acid) solution, a catalyst and a dehydrating agent in an amount equal to or more than the stoichiometric amount, and by evaporating the organic solvent. Accordingly, a solid thermoplastic polyimide resin can be obtained. The dehydrating agent for the chemical method includes, for example, aliphatic acid anhydrides such as acetic acid anhydride and aromatic acid anhydrides such as benzoic acid anhydride. Examples of catalyst include aliphatic tertiary amines such as triethylamine; aromatic tertiary amines such as dimethylaniline; and heterocyclic tertiary amines such as pyridine, α-picoline, β-picoline, γ-picoline and isoquinoline. Preferably, the chemical dehydration ring closing is carried out at temperature of 100° C. or lower, and the evaporation of the organic solvent is carried out at a temperature of 200° C. or lower for about 5 to 120 minutes.

As another method for obtaining a thermoplastic polyimide resin, there is a method such that solvent evaporation is not carried out in the above thermal or chemical dehydration ring closing. To say more particularly, it is a method for obtaining a solid polyimide resin, which comprises adding, to a poor solvent, a polyimide resin solution obtained by thermal imidization treatment or chemical imidization treatment by using a dehydration agent to precipitate the polyimide resin, removing unreacted monomers, and refining and drying the resulting resin. As the poor solvent, one which mixes well with a solvent but to which the polyimide is not easily dissolved should be selected. Examples include acetone, methanol, ethanol, isopropanol, benzene, methyl cellosolve, methyl ethyl ketone and the like, but the poor solvent is not limited to these examples. The thermoplastic polyimide resin can be obtained by these methods and used as the adhesive layer of the laminate of the present invention.

Further, as the adhesive, there is a curing adhesive using the curing reaction of a thermosetting resin. Examples of such thermosetting resin include a bismaleimide resin, a bisallylnadiimide resin, a phenol resin, a cyanate resin, an epoxy resin, an acrylic resin, a methacrylic resin, a triazine resin, a hydrosilyl curing resin, an allyl curing resin, an unsaturated polyester resin, a thermosetting polyimide resin and the like. They may be used alone or in combination. Other than the above thermosetting resins, thermosetting polymers containing a reactive group in side chains can also be used as the thermosetting component. The thermosetting polymers containing a reactive group in side chains are those which have a reactive group such as an epoxy group, an allyl group, a vinyl group, an alkoxysilyl group or a hydrosilyl group in the side chains or terminals of polymer chains. Among these, thermosetting polyimide resins containing a reactive group in the polyimide skeleton are excellent in heat resistance and preferable for the adhesive layer of the present invention.

The thermosetting polyimide resin containing a reactive group in side chains is described below. As an example of a practical production method, there are (1) a method for obtaining a thermosetting polyimide in accordance with the method of producing a thermoplastic polyimide resin mentioned above, in which diamine components and acid dianhydride components having a functional group such as an epoxy group, a vinyl group, an allyl group, a methacryl group, an acryl group, an alkoxysilyl group, a hydrosilyl group, a carboxy group, a hydroxy group and a cyano group are used as the monomer components and (2) a method of obtaining a thermosetting polyimide resin by producing a solvent-soluble polyimide having a hydroxyl group, a carboxyl group or an aromatic halogen group according to the method of producing a thermoplastic polyimide resin mentioned above, and then introducing a functional group such as an epoxy group, a vinyl group, an allyl group, a methacryl group, an acryl group, an alkoxysilyl group, a hydrosilyl group, a carboxy group, a hydroxy group or a cyano group into the polyimide by a chemical reaction.

To the thermosetting resin may be further added a radical reaction initiator such as organic peroxides; a reaction promoting agent; an auxiliary cross-linking agent such as triallyl cyanurate or triallyl isocyanurate. And if necessary, commonly used epoxy curing agents such as acid dianhydride-, amine- and imidazole-based agents and a variety of coupling agents in order to improve heat resistance and adhesion property may be added. Further, for the purpose of controlling the fluidity of the adhesive layer at the time of the thermal adhesion, a thermosetting resin may be added to the thermoplastic resin. To this end, it is desired to add the thermosetting resin in an amount of 1 to 10,000 parts by weight, preferably 5 to 2,000 parts by weight based on 100 parts by weight of the thermoplastic resin. If the amount of the thermosetting resin is too large, the adhesive layer may become brittle and on the other hand, if the amount is too small, the fluidity of the resin of the adhesive layer may be deteriorated, burying of a circuit without voids may not be achieved or adhesion property may be deteriorated.

One method for lamination by the adhesive is a method involving steps of laminating a metal foil on one or both faces of a synthetic resin film which is coated with an adhesive solution and dried, by using a heating roll or a thermal press, and if necessary, further heating the resulting laminate to cure the adhesive. A special apparatus such as a vacuum laminator or a vacuum press is also usable. For the heating to cure the adhesive, other than a common hot air oven, heating by far infrared ray radiation, vacuum heating, microwave heating and other manners can be employed and also heating by a thermal press in pressurized condition is also possible. Herein, the heating temperature at the time of producing a laminate of the synthetic resin film and the metal foil is preferably at most 220° C., more preferably at most 200° C., and further preferably at most 180° C. If the heating temperature is higher than 220° C., there is a tendency that a carrier film is not peeled from the metal foil successfully. Also, in case of laminating the laminate of the present invention on an inner layer wiring board, it is preferable that the lamination is possible at a heating temperature of at most 200° C. in order to utilize the laminate of the present invention for a wide range of purposes. Incidentally, it is preferable that the heating temperature is as low as possible from many points of view such as deflection of the laminate and peeling property of the carrier-attached metal foil. In the meantime, since a synthetic resin film without adhesive has low heat resistance and an adhesive layer in case of using adhesive has low heat resistance it is preferable to adjust the temperature high to the extent that the heat resistance of the synthetic resin film and the adhesive is not deteriorated, depending on each case.

As other methods of using an adhesive, it is possible to cast an adhesive resin solution on a support, remove the solvent to obtain a sheet, and then laminate the sheet on the synthetic resin film. It is also possible to laminate the adhesive on a metal foil and then laminate the adhesive-attached metal foil on the synthetic resin film.

The thickness of the adhesive is preferably 1 to 15 μm after drying. If it exceeds 15 μm, that is, the insulating layer becomes thicker, it tends to become difficult to satisfy the requirement of making the via diameter small along with the requirement of narrowing the pitches. If it is thinner than 1 μm, a sufficient amount of the adhesive cannot be supplied to the roughened face of the metal foil and as a result, contact of the adhesive with the roughened surface of the metal foil is insufficient and therefore, the adhesion strength tends to be decreased.

The polyimide film to be employed for the present invention can be obtained by a well known method. That is, a poly(amide acid) polymer solution obtained by polymerizing a practically equivalent mole of one or more tetracarboxylic acid dianhydride components and one or more diamine components in an organic polar solvent is spread and applied on a support member such as a glass plate or a stainless belt and then thermally dried and cured to the extent that the resulting film has a self-supporting property. At that time, so-called chemical cure method may be carried out, which comprises adding, to the poly(amide acid), a curing agent (hereinafter, referred to as a chemical cure agent) produced by mixing dehydration agent for promoting imidization reaction of the poly(amide acid), a catalyst and a solvent before the poly(amide acid) polymer solution is spread and applied, then mixing and stirring the mixture. As compared with a thermal cure method in which the poly(amide acid) is imidized only by heating without using the chemical cure agent, the chemical cure method is preferable in view of tensile modulus of the polyimide film, adhesion strength to the thin film and other physical properties.

The typical tetracarboxylic acid dianhydride to be employed for production of the poly(amide acid) polymer includes aromatic tetracarboxylic acid dianhydrides such as pyromellitic acid dianhydride, 3,3',4,4'-benzophenonetetracarboxylic acid dianhydride, 3,3',4,4'-diphenylsulfonetetracarboxylic acid dianhydride, 1,4,5,8-naphthalenetetracarboxylic acid dianhydride, 2,3,6,7-naphthalenetetracarboxylic acid dianhydride, 4,4'-oxydiphthalic acid anhydride, 3,3',4,4'-dimethyldiphenylsilanetetracarboxylic acid dianhydride, 3,3',4,4'-tetraphenylsilanetetracarboxylic acid dianhydride, 1,2,3,4-furantetracarboxylic acid dianhydride, 4,4'-bis(3,4-dicarboxyphenoxy)diphenyldipropane dianhydride, 4,4'-hexafluoroisopropylidenediphthalic acid anhydride, 3,3',4,4'-biphenyltetracarboxylic acid dianhydride, 2,3,3',4'-biphenyltetracarboxylic acid dianhydride, p-phenylene-bis(trimellitic acid monoester anhydride) and p-phenylenediphthalic acid anhydride.

Among the tetracarboxylic acid dianhydrides, mixtures containing 20 to 80% by mole of the pyromellitic acid dianhydride and an optional ratio of p-phenylenebis(trimellitic acid monoester anhydride) are preferable to achieve tensile modulus of at least 4 GPa. However, the combination of the tetracarboxylic acid dianhydrides described above is an example to obtain a polyimide film suitable for the synthetic resin film constituting the laminate of the present invention, and it is riot limited thereto. Thus, combinations and ratios of the tetracarboxylic acid dianhydrides to be employed may be changed to adjust properties of the polyimide film.

On the other hand, the typical diamine component to be employed for production of the poly(amide acid) polymer includes aromatic diamines such as 4,4'-diaminodiphenyl ether, 3,4'-diaminodiphenyl ether, 2,2-bis(4-aminophenoxyphenyl)propane, 1,4-bis(4-aminophenoxy)benzene, 1,3-bis(4-aminophenoxy)benzene, 1,3-bis(3-aminophenoxy)benzene, bis(4-(4-aminophenoxy)phenyl)sulfone, bis(4-(3-aminophenoxy)phenyl) sulfone, 4,4'-bis(4-aminophenoxy)biphenyl, 2,2-bis(4-aminophenoxyphenyl)hexafluoropropane, 4,4'-diaminodiphenylsulfone, 3,3'-diaminodiphenylsulfone, 9,9-bis(4-aminophenyl)fluorene, bisaminophenoxy ketone, 4,4'-(1,4-phenylenebis(1-methylethylidene))bisaniline, 4,4'-(1,3-phenylenebis(1-methylethylidene))bisaniline, m-phenylenediamine, p-phenylenediamine, 4,4'-diaminobenzanilide, 3,3'-dimethyl-4,4'-diaminobiphenyl and 3,3'-dimethoxy-4,4'-diaminobiphenyl, and other aliphatic diamines.

Among these diamine components, one example of a preferable combination to obtain the polyimide film is a combination of 20 to 80% by mole of p-phenylenediamine and 80 to 20% by mole of 4,4'-diaminodiphenyl ether. A more preferable combination is 30 to 70% by mole of the former and 70 to 30% by mole of the latter, and further preferable combination is 40 to 60% by mole of the former and 60 to 40% by mole of the latter. Further, in place of p-phenylenediamine, 4,4'-diaminobenzanilide may be employed. The combinations of the diamine components described above are examples to obtain the polyimide film suitable for the synthetic resin film constituting the laminate of the present invention, and they are not limited thereto. Thus, combinations and ratios of the diamine components to be employed may be changed to control properties of the polyimide film.

Examples of organic polar solvents to be employed for the generation reaction of the poly(amide acid) copolymer include sulfoxide solvents such as dimethyl sulfoxide and diethyl sulfoxide; formamide solvents such as N,N-dimethylformamide and N,N-diethylformamide; acetamide solvents such as N,N-dimethylacetamide and N,N-diethylacetamide; pyrrolidone solvents such as N-methyl-2-pyrrolidone and N-vinyl-2-pyrrolidone; phenol solvents such as phenol, o-, m- or p-cresol, xylenol, halogenated phenol, catechol; hexamethyl phosphorus amide; γ-butyrolactone; and the like. They are preferable to be employed alone or in form of mixtures and further, an aromatic hydrocarbon such as xylene or toluene may be used partially.

The weight average molecular weight of the poly(amide acid), which is a precursor of the polyimide film constituting a desirable laminate of the present invention, is preferably 10,000 to 1,000,000. If the weight average molecular weight is less than 10,000, the obtained film tends to become brittle. On the other hand, if it exceeds 1,000,000, the poly(amide acid) varnish, a polyimide precursor, has too high viscosity and handling may be difficult.

From the viewpoint of handling property, it is preferable that 5 to 40% by weight, preferably 10 to 30% by weight of a poly(amide acid) copolymer is dissolved in the organic polar solvent.

A variety of organic additives, inorganic fillers or various reinforcing materials may be added to the poly(amide acid) to obtain a composite polyimide film.

The volatile component content and the imidization ratio of the gel film are controlled so as to keep them in prescribed ranges by a thermal or chemical method, or combination of the thermal and the chemical method. From the viewpoint of properties of the obtained polyimide film and productivity, it is preferable to combine the chemical method and the thermal method together. More particularly, to the poly(amide acid) copolymer solution is added a mixed solution containing an aliphatic acid anhydride such as acetic anhydride in an amount about 0.5 to 10 times as much as the number by mole of the poly(amide acid) portion of the poly(amide acid) copolymer solution, a tertiary amine in an amount about 0.1 to 10 times as much and a solvent, followed by even mixing, and the resulting solution is spread on and applied in the form of film, and heated at 50° C. to 200° C. for about 1 minute to 1 hour to obtain the film.

The content of the volatile component of the obtained gel film can be calculated from the expression (1):

$$(A-B) \times 100/B \qquad (1)$$

In the formula, the reference characters A and B represent the followings:

A: the weight of the gel film

B: the weight of the gel film after heating at 450° C. for 20 minutes

The imidization ratio can be measured by an infrared absorption spectrometry and calculated from the expression (2):

$$(C/D) \times 100/(E/F) \qquad (2)$$

In the formula, the reference characteristics C, D, E and F represent the followings:

C: the absorption peak height of the gel film at 1,370 cm$^{-1}$

D: the absorption peak height of the gel film at 1,500 cm$^{-1}$

E: the absorption peak height of the polyimide film at 1370 cm$^{-1}$

F: the absorption peak height of the polyimide film at 1370 cm$^{-1}$

The content of the volatile component is in the range of 5 to 300% by weight, preferably 5 to 100% by weight, and more preferably 5 to 50% by weight. On the other hand, the imidization ratio is in the range of at least 50%, preferably at least 70%, more preferably 80% or higher, and most preferably at least 85%.

The synthetic resin film which constitutes the laminate of the present invention is preferably a polyimide film as described above. In particular, a polyimide film containing at least one element selected from the group consisting of Al, Si, Ti, Mn, Fe, Co, Cu, Zn, Sn, Sb, Pb, Bi and Pd is used since it has excellent adhesion property. The polyimide film can be produced by immersing a partially imidized or dried poly(amide acid) film (hereinafter referred also as to a gel film) in a solution of a compound containing at least one element selected from the group consisting of Al, Si, Ti, Mn, Fe, Co, Cu, Zn, Sn, Sb, Pb, Bi and Pd and then completely drying and imidizing the resulting gel film, or by applying the solution of the compound containing at least one of the above elements to the gel film and then completely drying and imidizing the resulting gel film.

It is preferable that the gel film is immersed in a solution of a compound containing at least one of the above elements or applied with the solution. As the compound containing at least one of the above elements, organic or inorganic compounds containing at least one of the above elements is preferably used.

To say more particularly, the inorganic compounds include, for example, halogenides such as chlorides and bromides, oxides, hydroxides, carbonates, nitrates, nitrites, phosphates, sulfates, silicates, borates, condensed phosphates and the like.

The organic compounds include, for example, those containing neutral molecules such as alkoxides, acylates, chelates, diamines and diphosphines; those containing acetylacetonate ion, carboxylic acid ion or dithiocarbamic acid ion; and also cyclic legands such as porphyrin.

The concentration of the solution is preferably 0.01 to 10% by weight, more preferably 0.1 to 5% by weight.

Preferable elements in the compound having at least one of the above elements, in which the gel film is immersed or which is applied to the gel film, are Si and Ti. The compound containing these elements, such as a silicon compound or a titanium compound, may be supplied in form of alkoxide, acylate, chelate or metal salt.

The silicon compound includes aminosilane-based compounds such as N-β-(aminoethyl)-γ-aminopropyltrimethoxysilane, N-β(aminoethyl)-γ-aminopropylmethyldimethoxysilane, N-phenyl-γ-aminopropyltrimethoxysilane, γ-aminopropyltriethoxysilane; and epoxysilane-based compounds such as β-(3,4-epoxycyclohexyl)ethyltrimethoxysilane, γ-glycidoxypropyltrimethoxysilane, γ-glycidoxypropylmethyldimethoxysilane. Preferable titanium compounds are those represented by the following general formula. To say more particularly, examples thereof include tri-n-butoxytitanium monostearate, diisopropoxytitanium bis(triethanolaminate), butyltitanate dimer, tetra-n-butyltitanate, tetra (2-ethylhexyl)titanate, titanium octylene glycolate and the like. In addition, dihydroxy-bis(ammonium lactate) titanium, dihydroxytitanium bislactate and the like are also usable. The most preferable one is tri-n-butoxytitanium monostearate or dihydroxytitanium bislactate.

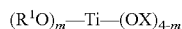

wherein m=an integer of 0 to 4;

X:

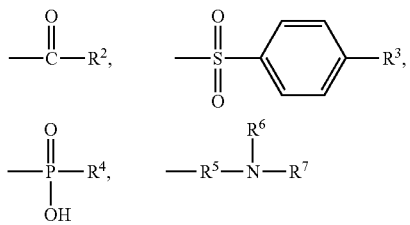

a hydrocarbon group having 3 to 18 carbon atoms, or a carboxylic acid having 3 to 18 carbon atoms and ammonium salt thereof;

$R^1$: H or a hydrocarbon group having 3 to 18 carbon atoms;

$R^2$ and $R^3$: a hydrocarbon group having 3 to 18 carbon atoms;

$R^4$: a hydrocarbon group having 3 to 18 carbon atoms or

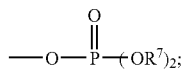

$R^5$ and $R^6$: a hydrocarbon group having 3 to 18 carbon atoms; and $R^7$: a hydrocarbon group having 2 to 18 carbon atoms.

The solvent to be employed for the solution may be any solvent which can dissolve the compound. For example, water, toluene, tetrahydrofuran, 2-propanol, 1-butanol, ethyl acetate, N,N-dimethylformamide, acetylacetone and the like are usable. These solvents may be used in form of a mixture of two or more. In the present invention, N,N-dimethylformamide, 1-butanol, 2-propanol, and water are especially preferable.

After applying the solution to the gel film or immersing the gel film in the solution, it is preferable to add a step of removing excess droplets on the surface because such a step enables to obtain a polyimide film excellent in appearance and free from surface unevenness. To remove the droplets, a known method using a nip roll, an air knife, a doctor blade and the like can be employed, and the nip roll is preferably used from the viewpoint of appearance, droplet removal and workability of the film.

The gel film after being applied with the solution or being immersed in the solution is held at its edges by using tenter clips or pins for shrinkage inhibition, in order to prevent the film from shrinking in the tentering step, and then heated step by step, dried and imidized to obtain the polyimide film. To say more particularly, the film is preferably heated step by step from about 200° C. and finally at 500° C. or higher for 15 to 600 seconds.

The synthetic resin film made of the polyimide film obtained in such a manner is provided with hydrolysis resistance. That is, the film has a characteristic such that the retention ratio of the tear propagation strength is at least 80% after exposure to environmental conditions of 150° C. and 100% RH for 12 hours compared with the tear propagation strength before the exposure.

The laminate produced by laminating the polyimide film with a metal layer has a high initial adhesion strength between the metal layer and the film, and shows sufficient heat resistance and heat-and-humidity resistance of the adhesion. When the film is employed for the laminate of the present invention or a multilayer wiring plate, the obtained product is excellent in electric insulation property without causing insulation deterioration in high temperature and high humidity environments.

The thickness of the polyimide film is not particularly limited, but in order to meet the requirement of high capability of electric appliances, the thinner the film the more preferable. To say more particularly, suitable films are those having a thickness of at most 50 μm, preferably at most 25 μm, and more preferably at most 15 μm. There is no particular lower limit of the thickness of the polyimide film, but the lower limit of the film thickness is about 1 μm in the present technical level from the viewpoint that it is possible to form a film with practically allowable evenness and practically usable strength.

The tensile modulus of the polyimide film is preferably at least 4 GPa, more preferably at least 6 GPa. If it is lower than 4 GPa, handling of the film becomes difficult, and wrinkling tends to be caused easily when the film is laminated on a thin copper foil. On the other hand, the upper limit is not particularly limited. In general, however, the higher the elastic modulus, the more brittle the film. Therefore, it is preferable to adjust the elastic modulus to such a value that brittleness is not significant.

The linear expansion coefficient of the polyimide film is preferably at most 20 ppm, more preferably at most 13 ppm. Since the laminate of the present invention has a layered structure with a metal, if the linear expansion coefficient of the polyimide film is considerably different from that of the metal, deflection tends to increase or the dimensional accuracy tends to be deteriorated. Taking such a matter into consideration, the upper limit and the lower limit of the linear expansion coefficient are 20 ppm and 0 ppm, respectively.

The polyimide film of the present invention may be incorporated with an inorganic or organic filler, a plasticizer such as organic phosphorus compound or an oxidation inhibitor in a known manner. In addition, for the purpose of improving the adhesion property between the metal layer and the adhesive layer, the film may be subjected to heating treatment, sand blast treatment, degreasing washing treatment, ultraviolet radiation treatment, flaming treatment and the like. The treatment may be carried out by employing known surface treatment methods separately or in combination of some of the treatment methods including a method for applying a variety of organic substances such as a thermosetting resin, a thermoplastic resin, an organic monomer or a coupling agent as a primer; a method for surface treating with a metal hydroxide or an organic alkali; a method for grafting the surface, corona discharge treatment; and plasma discharge treatment.

The method for laminating the metal layer on the polyimide film containing at least one element selected from the group consisting of Al, Si, Ti, Mn, Fe, Co, Cu, Zn, Sn, Sb, Pb, Bi and Pd may be selected from the group consisting of sputtering, ion plating, electron beam evaporation, resistance heating evaporation, chemical plating and electric plating from the viewpoint that the methods provide excellent adhesion property. These methods may be carried out in a common manner, and metals such as copper, nickel, tin, solder and chromium are employed. The physical evaporation methods such as sputtering, ion plating, electron beam evaporation and resistance heating evaporation are not industrially suitable to form a metal film of several μm thick. Therefore, after a thin film with a thickness of at most 1 μm is formed by the physical evaporation methods, it is preferable to successively carry out chemical plating or electric plating to give a desired thickness.

The metal foil with a thickness of 5 μm or thinner tends to have low strength, low stiffness and inferior handling property. In the present invention, it is preferable to improve the handling property by using a metal foil thinner than 10 μm together with a carrier having certain stiffness. In this case, the carrier is composed of a metal foil, a metal plate or a polymer film. It is preferable that the carrier is laminated on the metal foil according to a sticking method or a bonding method with such a peeling strength that the carrier can be peeled relatively easily by a weak force when it becomes unnecessary. The peeling strength is preferably lower than 200 gf/cm. In this case, it is preferable that the carrier is laminated with the metal foil at the time of handling the metal foil, but at the time of removing the carrier after laminating the metal foil with the polyimide film, it is preferable that the carrier is peeled smoothly from the metal foil. Accordingly, it is preferable that the metal foil has an adhesion strength as high as preventing the carrier from peeling at the time of handling the metal foil and lower than the adhesion strength between the metal foil and the polyimide film.

The metal foil is subjected to various steps and receives stress of heat, pressure or tensile force when laminated with the polyimide film. It is desired that the carrier and the metal foil have similar dimensional changes which are caused by these stresses. For these reasons, a metal similar to the foil is the most preferable as the material of the carrier for the metal foil.

The proper thickness of the carrier for the metal foil differs depending on the material. However, in many cases, the thickness is preferably 10 to 300 μm. If the thickness of the carrier exceeds 300 μm, the handling property is adversely deteriorated or the cost tends to be increased. On the other hand, if it is thinner than 10 μm, it tends to be difficult to improve the handling property, which is the original purpose of the carrier.

Furthermore, in the present invention, the metal foil may be subjected to a mat treatment for roughening one or both faces or a blackening treatment for forming an oxidation layer in order to improve the adhesion property of the metal foil to the synthetic resin film and the adhesive. In addition, in order to improve the heat resistance and the humidify resistance of the metal foil, one or both faces of the metal foil may be subjected to rust prevention treatment and glossing treatment.

A protection film may also be disposed on the surface of the laminate of the present invention in order to protect the surface of the laminate.

The laminate of the present invention obtained in the manner as described above comprises a synthetic resin film having excellent appearance without surface unevenness as an insulating layer and a thin metal layer. Accordingly, it is useful for narrowing the pitches of circuits. Further, a printed wiring board manufactured by using the laminate has excellent adhesion property between its metal layer and synthetic resin film, and therefore adhesion to the synthetic resin film is excellent even if the circuit is narrowly pitched. Also, the printed wiring board shows excellent characteristics such that the adhesion between the synthetic resin film and the patterned circuit is stable against factors such as heat and humidity. Accordingly, the laminate of the present invention has high heat resistance, wiring patterns with narrow pitches, vias with a small diameter, insulating layer having uniform thickness, and stable adhesion between the metal layer and the synthetic resin film, and is suitably used for a printed wiring substrate and a multilayer printed wiring board contributing to miniaturization, high capability and functional improvement of electronic equipment.

Although the laminate of the present invention and its constituent materials are described above, the present invention is not limited to these exemplified materials. The present invention can be carried out in embodiments of various improvement, modification or alteration based on the knowledge of persons skilled in the art within the scope of the present invention.

Hereinafter, the present invention will be described with reference to Examples. In Examples, ODA represents 4,4'-diaminodiphenyl ether; p-PDA represents p-phenylenediamine; BAPS-M represents bis(4-(3-aminophenoxy)phenyl) sulfone; DABA represents 4,4'-diaminobenzanilide; PMDA represents pyromellitic acid dianhydride; TMHQ represents p-phenylene bis(trimellitic acid monoester anhydride); ESDA represents 2,2-bis(4-hydroxyphenyl)propanebenzoate-3,3',4,4'-tetracarboxylic acid dianhydride; and DMF represents N,N-dimethylformamide. The tensile modulus of the synthetic resin film was measured in accordance with the method of ASTM D 882.

EXAMPLE 1

(1) A separable flask was charged with DMF, 1 equivalent of p-PDA and 1 equivalent of ODA. The mixture was sufficiently stirred at a room temperature until the diamine compounds were completely dissolved, and then cooled with ice. Subsequently, 1 equivalent of TMHQ was added thereto and stirring was carried out for 40 minutes with cooling. Then, 1 equivalent of PMDA was dissolved in DMF and this was gradually added to the mixture. Thereafter, stirring was carried out for 1 hour with cooling to obtain a DMF solution of a poly(amide acid) having a weight average molecular weight of about 100,000. The amount of DMF was controlled so that the concentration of monomers of the diamino compound and the aromatic tetracarboxylic acid compound was 18% by weight.

To 100 g of the poly(amide acid) solution were added 10 g of acetic acid anhydride and 10 g of isoquinoline. The resulting mixture was stirred until homogeneous and defoaming was carried out. The resulting solution was spread and applied on a glass plate, and dried at about 110° C. for about 5 minutes. Thereafter, the poly(amide acid) film was peeled from the glass plate to obtain a gel film which contains 40% by weight of a volatile component and has a imidization ratio of 85% and self-supporting property. The gel film was immersed in a dihydroxytitanium bislactate/1-butanol solution having a titanium concentration of 400 ppm for 10 seconds and excess droplets were removed. The gel film was further fixed in a frame and then heated at about 200° C. for about 10 minutes, at about 300° C. for about 10 minutes, at about 400° C. for about 10 minutes and at about 500° C. for about 10 minutes to carry out dehydration ring closing and drying to obtain a polyimide film with a thickness of about 12 μm. The obtained polyimide film had a tensile modulus of 6 GPa and a linear expansion coefficient of 12 ppm.

(2) A separable flask was charged with DMF and 1 equivalent of BAPS-M. The mixture was sufficiently stirred at a room temperature until BAPS-M was completely dissolved and then cooled with ice. Subsequently, 1 equivalent of ESDA was added thereto and stirring was carried out for 1 hour with cooling to obtain a DMF solution of a poly(amide acid). The amount of DMF was controlled so that the concentration of monomers of the diamino compound and the aromatic tetracarboxylic acid compound was 30% by weight. To 500 g of the poly(amide acid) solution were added 35 g of β-picoline and 60 g of acetic acid anhydride, and stirring was carried out for 1 hour. Thereafter, further stirring was carried out for 1 hour at 100° C. to promote imidization. Subsequently, the resulting solution was added to methanol stirred at a high speed drop by drop to obtain a polyimide resin in the form of filaments. The resin was dried at 100° C. for 30 minutes and pulverized by a mixer, and the resultant was washed with methanol using a Soxhlet's extractor and dried at 100° C. for 2 hours to obtain a polyimide powder.

(3) Twenty g of the polyimide powder obtained in (2), 5 g of Epicoat 828 (available from Yuka Shell Epoxy K.K.) as a bisphenol A epoxy resin and 0.015 g of 2-ethyl-4-methylimidazole as a curing agent were dissolved in 83 g of DMF.

(4) The varnish obtained in (3) was spread and applied on both faces of the polyimide film obtained in (1) so that the thickness of the respective films became 5 μm after drying. The applied varnish was then dried at 100° C. for 10 minute and at about 150° C. for about 20 minutes to obtain a laminate with a total thickness of 22 μm. A 3-μm thick copper foil with a 35-μm thick carrier copper foil was pressed on one face of the obtained laminate at 200° C. under 3 MPa for 5 minutes to laminate the copper foil with the polyimide film. The adhesive on both faces of the synthetic resin was half-cured at this stage.

(5) The laminate obtained in (4) was laminated on the surface of a printed wiring board having wiring patterns thereon in such a manner that the adhesive and the wiring patterns were brought into contact with each other. The resulting laminate was preliminarily bonded by pressing the same at 200° C. under 3 MPa for 5 minutes. Thereafter, the resulting laminate was heated at 170° C. for 3 hours in a hot air oven to cure the adhesive completely, and then the carrier of the copper foil was peeled to obtain a multilayer printed wiring board having a 3-μm thick metal layer on the surface.

The copper foil on the surface of the obtained multilayer printed wiring board was patterned by using an etching resist of a photosensitive resin to form circuits with lines and spaces of 25 μm and 25 μm. The circuit patterning was excellently carried out without causing short-circuit, disconnection or pattern exfoliation.

EXAMPLE 2

A multilayer printed wiring board having a 3-μm thick metal layer on the surface was obtained in the same manner as in Example 1, except that a dihydroxytitanium bislactate/ 1-butanol solution having a titanium concentration of 1,000 ppm was used.

The copper foil on the surface of the obtained multilayer printed wiring board was patterned by using an etching resist of a photosensitive resin to form circuits with lines and spaces of 25 μm and 25 μm. The circuit patterning was excellently carried out without causing short-circuit, disconnection or pattern exfoliation.

EXAMPLE 3

A multilayer printed wiring board having a 3-μm thick metal layer on the surface was obtained in the same manner as in Example 1, except that a γ-aminopropyltriethoxysilane/ 1-butanol solution having a silicon concentration of 400 ppm was used.

The copper foil on the surface of the obtained multilayer printed wiring board was patterned by using an etching resist of a photosensitive resin to form circuits with lines and spaces of 25 μm and 25 μm. The circuit patterning was excellently carried out without causing short-circuit, disconnection or pattern exfoliation.

EXAMPLE 4

A multilayer printed wiring board having a 3-μm thick metal layer on the surface was obtained in the same manner as in Example 1, except that a γ-aminopropyltriethoxysilane/ water solution having a silicon concentration of 3,000 ppm was used.

The copper foil on the surface of the obtained multilayer printed wiring board was patterned by using an etching resist of a photosensitive resin to form circuits with lines and spaces of 25 μm and 25 μm. The circuit patterning was excellently carried out without causing short-circuit, disconnection or pattern exfoliation.

EXAMPLE 5

A separable flask was charged with DMF, 3 equivalents of DABA and 1 equivalent of ODA. The mixture was sufficiently stirred at room temperature until the diamine compounds were completely dissolved and then cooled with ice. Subsequently, 4 equivalents of TMHQ was added and stirred with cooling for 1 hour to obtain a DMF solution of a poly(amide acid) having a weight average molecular weight of about 100,000. The amount of DMF was controlled so that the concentration of monomers of the diamino compound and the aromatic tetracarboxylic acid compound was 18% by weight.

To 100 g of the poly(amide acid) solution were added 10 g of acetic acid anhydride and 8 g of isoquinoline. The resulting mixture was stirred until homogeneous and defoaming was carried out. The resulting solution was spread and applied on a glass plate, and dried at about 110° C. for about 5 minutes. Thereafter, the poly(amide acid) film was peeled from the glass plate to obtain a gel film which contains 40% by weight of a volatile component and has a imidization ratio of 85% and self-supporting property. The gel film was immersed in a dihydroxytitanium bislactate/1-butanol solution having a titanium concentration of 1,000 ppm for 10 seconds and excess droplets were removed. The gel film was further fixed in a frame and then heated at about 200° C. for about 10 minutes, at about 300° C. for about 10 minutes, at about 400° C. for about 10 minutes and at about 500° C. for about 10 minutes to carry out dehydration ring closing and drying to obtain a polyimide film with a thickness of about 12 µm. The obtained polyimide film had a tensile modulus of 10 GPa and a linear expansion coefficient of 5 ppm.

A multilayer printed wiring board having a 3-µm thick metal layer on the surface was obtained in the same manner as in Example 1, except that the above polyimide film was used.

The copper foil on the surface of the obtained multilayer printed wiring board was patterned by using an etching resist of a photosensitive resin to form circuits with lines and spaces of 25 µm and 25 µm. The circuit patterning was excellently carried out without causing short-circuit, disconnection or pattern exfoliation.

EXAMPLE 6

A multilayer printed wiring board having a 3-µm thick metal layer on the surface was obtained in the same manner as in Example 5, except that a γ-aminopropyltriethoxysilane/water solution having a silicon concentration of 3,000 ppm was used.

The copper foil on the surface of the obtained multilayer printed wiring board was patterned by using an etching resist of a photosensitive resin to form circuits with lines and spaces of 25 µm and 25 µm. The circuit patterning was excellently carried out without causing short-circuit, disconnection, or pattern exfoliation.

EXAMPLE 7

(1) A 20-nm thick nickel layer and successively a 100-nm thick copper layer were formed by magnetron DC sputtering method on the polyimide film produced in (1) of Example 1. Subsequently, a copper layer was formed by an electroplating method using a copper sulfate plating solution to give a total thickness 3 µm. The above electro-copper plating was carried out by plating at room temperature for 6 minutes after preliminary washing for 30 seconds in a 10% sulfuric acid solution. The current density in that case was 2 A/dm².

(2) Subsequently, the varnish obtained in (3) of Example 1 was spread and applied on the polyimide film face of the copper thin film-bearing polyimide film obtained in (1) so that the thickness was 9 µm after drying. The applied varnish was then dried at 100° C. for 10 minute and at about 150° C. for about 20 minutes to obtain a laminate.

(3) In the same manner as described in (5) of Example 1, the laminate obtained in (2) was laminated on the surface of a printed wiring board having wiring patterns to obtain a multilayer printed wiring board bearing a 3 µm-thick metal layer on the surface. The copper foil on the surface of the obtained multilayer printed wiring board was patterned by using an etching resist of a photosensitive resin to form circuits with lines and spaces of 25 µm and 25 µm. The circuit patterning was excellently carried out without causing short-circuit, disconnection or pattern exfoliation.

EXAMPLE 8

A multilayer printed wiring board having a 3-µm thick metal layer on the surface was obtained in the same manner as in Example 7, except that the polyimide film produced in Example 5 was used.

The copper foil on the surface of the obtained multilayer printed wiring board was patterned by using an etching resist of a photosensitive resin to form circuits with lines and spaces of 25 µm and 25 µm. The circuit patterning was excellently carried out without causing short-circuit, disconnection or pattern exfoliation.

COMPARATIVE EXAMPLE 1

A multilayer printed wiring board having a 9-µm thick metal layer on the surface was obtained in the same manner as in Example 1, except for using a 9-µm thick electrolytic copper foil instead of the 3-µm thick foil. The copper foil on the surface of the obtained multilayer printed wiring board was patterned by using an etching resist of a photosensitive resin, and it was tried to form circuits with lines and spaces of 25 µm and 25 µm. However, the line width was not uniform and short-circuit and disconnection took place.

COMPARATIVE EXAMPLE 2

A multilayer printed wiring board was obtained in the same manner as in Example 1, except that a series of the steps of immersing a gel film in the dihydroxytitanium bislactate/1-butanol solution having a titanium concentration of 400 ppm for 10 seconds and removing excess droplets.

The copper foil on the surface of the obtained multilayer printed wiring board was patterned by using an etching resist of a photosensitive resin to form circuits with lines and spaces of 25 µm and 25 µm. However the adhesion strength between the circuit layer and the synthetic resin film layer was weak and accordingly, the pattern exfoliation took place.

INDUSTRIAL APPLICABILITY

The laminate of the present invention can provide a multilayer printed wiring board which have high heat resistance, wiring patterns with narrow pitches, vias with a small diameter, insulating layer having uniform thickness and stable adhesion between conductors. Also, the laminate of the present invention can be used for production of a multilayer wiring board in various manners.

The invention claimed is:

1. A laminate comprising:
   a) a polyimide film having opposite faces, said polyimide film having a thickness of at most 50 μm, a tensile modulus of at least 4 GPa and a coefficient of linear expansion of at most 20 ppm;
   b) a metal layer laminated on one face of said polyimide film, said metal layer comprising a metal foil having a thickness of at most 5 μm; and
   c) an adhesive layer laminated on the other face of said polyimide resin film.

2. The laminate of claim 1, wherein the polyimide thermoplastic film and the metal layer are bonded together with an adhesive.

3. The laminate of claim 1, wherein the adhesive layer contains a polyimide resin.

4. The laminate of claim 3, wherein the adhesive layer containing the thermoplastic polyimide resin further contains a thermosetting resin.

5. The laminate of claim 1, wherein the metal foil is a metal foil supported by a carrier.

* * * * *